United States Patent [19]

Byun

[11] Patent Number: 5,607,884
[45] Date of Patent: Mar. 4, 1997

[54] METHOD FOR FABRICATING MOS TRANSISTOR HAVING SOURCE/DRAIN REGION OF SHALLOW JUNCTION AND SILICIDE FILM

[75] Inventor: Jeong S. Byun, Chungcheongbuk-do, Rep. of Korea

[73] Assignee: LG Semicon Co., Ltd., Chungcheongbuk-do, Rep. of Korea

[21] Appl. No.: 190,664

[22] Filed: Feb. 2, 1994

[30] Foreign Application Priority Data

Dec. 16, 1993 [KR] Rep. of Korea ............... 28018/1993

[51] Int. Cl.$^6$ .................. H01L 21/225; H01L 21/335
[52] U.S. Cl. ............... 437/41; 437/160; 437/200; 437/950
[58] Field of Search .................. 437/200, 761, 437/762, 950, 40 SM, 41 SM, 160

[56] References Cited

U.S. PATENT DOCUMENTS

| | | |
|---|---|---|
| 4,887,146 | 12/1989 | Hinode . |
| 4,920,073 | 4/1990 | Wei et al. ............... 437/200 |
| 4,923,822 | 5/1990 | Wang et al. ............... 437/41 |
| 5,102,827 | 4/1992 | Chen et al. ............... 437/200 |
| 5,196,360 | 3/1993 | Doan et al. ............... 437/41 |
| 5,223,081 | 6/1993 | Doan ............... 156/628 |
| 5,268,317 | 12/1993 | Schwalke et al. ............... 437/41 |
| 5,413,957 | 5/1995 | Byun ............... 437/161 |

OTHER PUBLICATIONS

Fujimura, N., et al., "TiSi$_2$ Formation...", Applied Surface Science 41/42 (1989), pp. 272–276.
Jing, H., et al., "Ultra Shallow Junction Formations...", J. Electrochem. Soc., vol. 139, No. 1, Jan. 1992, pp. 196–218.
Paper Entitled "Ultra Shallow Junction Formation Using Diffusion From Silicides" By H. Jiang, et al., Published in *J. Electrochem. Soc.*, vol. 139, No. 1, Jan. 1992. pp. 196–206.

*Primary Examiner*—T. N. Quach
*Attorney, Agent, or Firm*—Morgan, Lewis and Bockius LLP

[57] ABSTRACT

A method for fabricating an MOS transistor having a source/drain region of shallow junction and a thin silicide film is disclosed. The present method takes advantage of the phase separation of the Ti-excessed titanium nitride film and is capable of forming a thin silicide film in a once metal thermal annealing process. The method employs dopant implant to the titanium nitride and silicide and thermal anneal for diffusion to form source and drain regions.

8 Claims, 6 Drawing Sheets

METHOD FOR FABRICATING MOS TRANSISTOR HAVING SOURCE/DRAIN REGION OF SHALLOW JUNCTION AND SILICIDE FILM

BACKGROUND OF THE INVENTION

The present invention relates, in general, to a method for fabricating an MOS transistor and, more particularly, to a method for fabricating a MOS transistor, capable of forming a thin silicide film with once thermal annealing and forming a source/drain region of shallow junction by use of a common ion-implanting apparatus.

As the integration technology for semiconductor has been developed in the last few years, MOS transistors of not more than several microns can be integrated. As a result of high integration, the size of MOS transistor becomes more small and the junction depth of source/drain region in the MOS transistor comes to be more shallow.

However, since the area resistance of a junction is inversely proportional to the depth of the junction, as the depth of the source/drain region becomes shallower, the area resistance of the junction is larger, increasing the parasitic resistance of a device.

In an effort to reduce the parasitic resistance and to improve the characteristics of the device in fabricating a very highly integrated circuit, a silicide film has been proposed to be formed on the source/drain region.

The area resistance of junction is proportional to a specific resistance and is inversely proportional to the depth of junction. While the specific resistance of silicon is about 200 $\mu\Omega\cdot cm$, that of the silicide film is around 50 $\mu\Omega\cdot cm$ even though a little difference is caused by its composition materials. Accordingly, taking advantage of the small specific resistance of the silicide, the area resistance of the shallow junction, a parasitic resistance, can be reduced.

As such a silicide film, a titanium silicide film is widely known to those skilled in the art.

Since the formation of titanium silicide film on a source/drain region results from the reaction of titanium with a silicon substrate constituting the junction as shown in the following formula, the formation of silicide film causes the source/drain region of silicon to consume in the amount corresponding to the thickness of the silicide film formed:

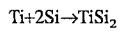

$$Ti + 2Si \rightarrow TiSi_2$$

Accordingly, because the thickness of the silicide film formed, that is, the consumed portion of the source/drain region is considered as a part of the depth of the junction, there have been demanded a technology for the formation of thin, stable silicide film. In addition, the method is required to give electrical uniformity to the interface between the silicon and the silicide film formed in the source/drain region of shallow junction.

Silicide are largely grouped into a polycide, which is formed by the reaction of polysilicon with a refractory metal and into a self-aligned silicide (hereinafter "SALICIDE"), which results from the reaction of silicon with refractory metals.

Description for conventional fabrication processes for MOS transistor is to be given with reference to some figures for better understanding of the background of the present invention.

Referring initially to FIGS. 1A through 1E, there are illustrated conventional processes for fabricating a MOS transistor having a source/drain region of shallow junction on which a silicide film formed.

First, as shown in FIG. 1A, a conventional double diffusion process is applied to a substrate 11, so as to form a low density source/drain region 15 and a high density source/drain region 17. For this, so-called LOCOS process is carried out to form a field oxide film 12 which sections the substrate 11 into an active channel region and a device separation region and then, a gate insulating film 13 and a gate of polysilicon film 14 are formed on a predetermined portion of the channel region, in due order. The low density source/drain region 15 is formed by using the gate 14 as a mask in implanting impurities having an opposite, conductive type from the substrate 11. On the other hand, the high density source/drain region 17 is formed adjacent to the low density source/drain region 15 by using the gate 14 and a pair of spacers 16 formed at both side walls of the gate 14 as a mask in implanting an opposite, conductive type from the substrate 11.

FIGS. 1B and 1C illustrate the formation of a titanium silicide (TiSi) film. As illustrated in these figures, a titanium film 18, which is a kind of a refractory metal, is thinly deposited on the entire surface of the resulting structure of FIG. 1A and then, is subjected to a primary thermal annealing process at about 700° C. During this primary thermal annealing, silicon atoms moves to the thin titanium film 18. That is, the reaction of the silicon atoms with the titanium occurs at the interface between the silicon substrate 11 and the thin titanium film 18 and the interface between the gate 14 of polysilicon and the thin titanium film 18, so as to form titanium silicide films 19 and 20 having a $C_{49}$ phase.

Next, as shown in FIG. 1D, all non-reacted, remaining titanium film 18 is removed with a $NH_4OH/H_2O_2$ solution. As mentioned above, the titanium silicide film 19 formed on the source/drain region 17 belongs to the SALICIDE, whereas the titanium silicide film 20 formed on the gate 14 has the property of polycide.

Finally, a secondary thermal annealing is applied at a temperature of not less than 800° C., so as to form titanium silicide films 19' and 20' having a $C_{54}$ phase, as shown in FIG. 1E. As a result, a MOS transistor is fabricated, wherein the thin titanium silicide film 19' is formed on the source/drain region 17 of shallow junction.

The reason that the above thermal annealing processes are separately carried out is as follows: if the thin titanium film formed is subjected to a metal thermal annealing process at a high temperature, the silicon atoms moves into the thin titanium film 18 and crosses over the spacers 16, so that not only is formed the titanium silicide film 19' of $C_{54}$ phase on the source/drain region and the gate 14 but also unnecessary metal bridges 21 are formed across on the spacers 16. Since the metal bridges 21 are conductive, there is caused a short.

Therefore, the primary thermal annealing is carried out at a low temperature to form the titanium silicide film 19 of $C_{49}$ only on the source/drain region 17 and then, non-reacted titanium film is removed so completely as not to form the metal bridges when the secondary thermal annealing process is performed at a high temperature to form the titanium silicide film 19' of $C_{54}$ phase.

In the titanium silicide film, there are present two polymorphies. One is a titanium silicide of $C_{49}$ (orthorhombic) structure, wherein lattice constant is a=3.62 Å, b=13.76 Å and c=3.605 Å. On the other hand, the other has a $C_{54}$ (orthorhombic) structure, wherein lattice constant is a=8.236 Å, b=4.773 Å and c=8.523 Å.

In the fabrication of semiconductor device, TiSi of $C_{54}$ structure is employed owing to its stability and lower specific resistance.

To form the titanium silicide film on the source/drain region, as mentioned above, the source/drain region must be consumed a little because the thickness of the silicide film formed, that is, consumed portion of the region is included in the junction depth of the source/drain region.

Since the contact resistance is generally increased as the thickness of the silicide film is increased, it is preferred to form the silicide film in the thickness of not more than 300 Å.

For the sake of forming the thin silicide film, the titanium film is to be thinly deposited in a previous process. However, since the thin titanium film and the thin silicide film are inferior in thermal stability, agglomeration occurs in the sequential, secondary thermal annealing process, lowering the device characteristic.

In addition, owing to the thermal instability caused by the thin thickness of the titanium silicide film formed by the conventional processes, there are extensively generated bends at the interface between the titanium silicide film 19' and the source/drain region 17 of silicon.

Among methods for forming a thin silicide film on a source/drain region of shallow junction, a method using silicide as diffusion source, that is, SADS method has known to be most useful.

SADS method has been reported in J. electrochem. Sec., 139, 196, 1992. This SADS method comprises of forming previously a silicide film on a silicon substrate, implanting dopant ions in the silicide film and applying a thermal annealing process to the silicide film to diffuse the dopants in the silicide into the silicon substrate, thereby forming a source/drain of shallow junction. In process order, this method is different from the method illustrated in FIG. 1 in which a source/drain region is formed in advance of the formation of a silicide film.

With reference to FIGS. 3A through 3G, there are shown conventional fabrication processes for MOS transistor, using SADS process.

As shown in FIG. 3A, so-called LOCOS process is carried out to form a field oxide film 32 which sections a substrate 31 into an active channel region and a device separation region and then, a gate insulating film 33 and a gate of polysilicon film 34 are formed on a predetermined portion of the channel region, in due order. Subsequently, a pair of spacers 35 consisting of an insulating film are formed at both side walls of the gate 34.

FIGS. 3B through 3E illustrate the formation of a silicide film. This is similar to the silicide formation shown in FIGS. 1B through 1E. That is, on the resulting structure of FIG. 3A, there is deposited a thin titanium film 36 and then, a primary thermal annealing is carried out at 700° C., forming a titanium silicide film 37 having the $C_{49}$ phase at the interface between the titanium film 36 and the silicon substrate 31 as well as another titanium silicide film 38 at the interface between the gate 34 and the titanium film 36.

After non-reacted titanium film is completely removed with a $NH_4OH/H_2O_2$ solution, a secondary thermal annealing process is carried out at high temperatures of not less than 800° C., so as to transform the titanium silicide films 37 and 38 having $C_{49}$ phase into titanium silicide films 37' and 38' having $C_{54}$ phase.

Thereafter, as shown in FIG. 3F, using a low acceleration energy of about 10 KeV, dopant ions having an opposite, conductive type from the substrate are implanted in the titanium silicide films 37' and 38'. For example, in a p type substrate (NMOS), $As^+$ ions are implanted. On the other hand, $BF^+$ ions are implanted in an n type substrate (PMOS).

Finally, as shown in FIG. 3G, a thermal annealing process is carried out at about 1,000° C., so as to diffuse the dopants implanted in the titanium silicide film 37' into the substrate 31.

As a result, a source/drain region 39 of shallow junction is formed along with the silicide film, finishing the fabrication of a MOS transistor.

This SADS method requires that, just after the ion-implantation, the dopants are to be distributed only in the titanium silicide film. The common ion-implanting process can be carried out only with the acceleration energy of not less than 30 KeV. If too large the ion-implanting energy is used, the dopants comes to be distributed even into the silicon substrate. This results in increase of leak current caused by a knock-on effect on ion-implantation.

To prevent the leak current, an ion-implanting apparatus using a low acceleration energy of around 10 KeV is required to be employed. However, the use of the low acceleration energy is disadvantageous in views of throughput and safety. For example, in order to distribute the dopants only in the titanium silicide film by use of the low acceleration energy of around 10 KeV, the substrate must be subjected into pre-amorphization by initially implanting dopants such as $Ge^+$ in the substrate.

In addition, since thermal annealing is carries out twice to form the titanium silicide film in spite of the use of SADS method, there occur problems caused in the conventional method shown in FIG. 1.

SUMMARY OF THE INVENTION

Therefore, an object of the present invention is to solve the problems encountered in prior arts and to provide a method for fabricating a MOS transistor having a thin silicide film and a source/drain region of shallow junction, capable of simplifying the fabrication processes and improving the characteristics of the device fabricated.

In accordance with the present invention, the above object can be accomplished by a method for fabricating an MOS transistor having source and drain regions of shallow depth and a silicide film, including the steps of: performing a field oxidation process to form a device separative field oxide film on a silicon substrate; forming an insulating film on the silicon substrate with an insulating film and a polysilicon film on the insulating film; patterning the insulating film and the polysilicon film to form a gate insulating film and a gate; forming oxide sidewall spacers on sidewalls of the gate; depositing a Ti-excessed titanium nitride film on the silicon substrate, the gate, the sidewall spacers and the field oxide film; performing a rapid thermal annealing process to form a titanium silicide film at an interface between the silicon substrate and the titanium nitride film and to form a titanium oxygen nitride film at an interface between the field oxide film and the titanium nitride film and at interfaces between the sidewall spacers and the titanium nitride film; implanting dopant ions in the titanium nitride film and the titanium silicide film; applying a thermal annealing process to the titanium nitride film and the titanium silicide film to diffuse the dopant ions into the silicon substrate, thereby forming the source and drain regions of shallow depth; and removing the titanium nitride film and the titanium oxygen nitride film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
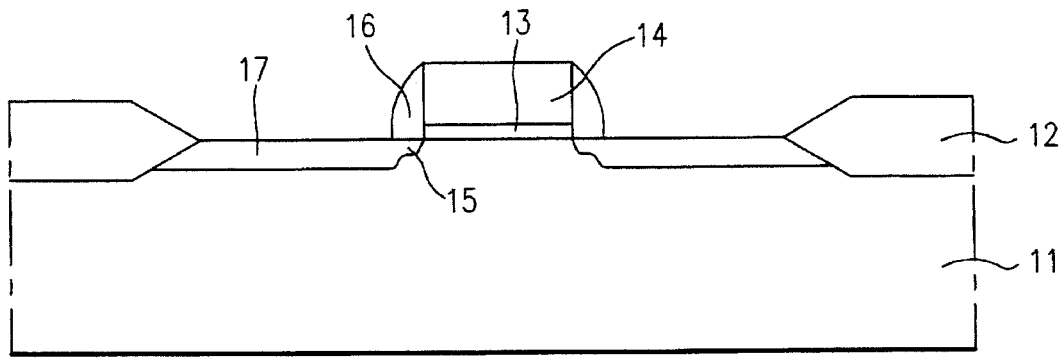
FIGS. 1A through 1E are schematic, cross-sectional views showing conventional fabrication processes for a MOS transistor having a thin silicide film and a source/drain region of shallow junction.
Figure 1B:
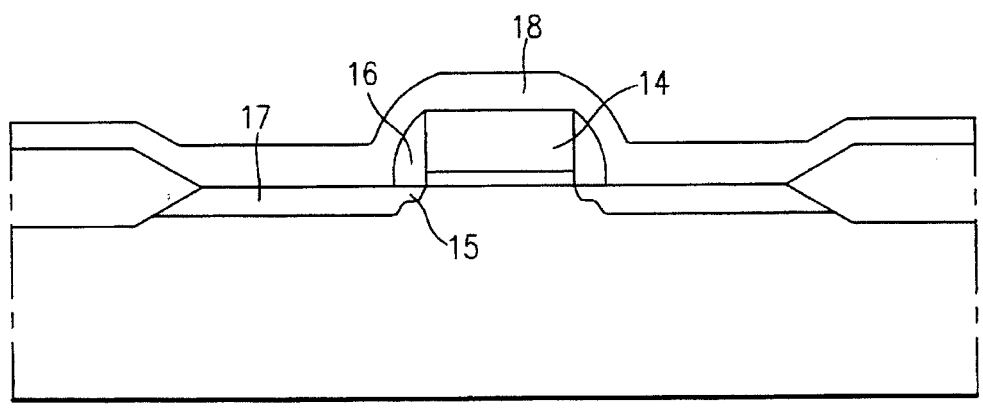
Figure 1C:
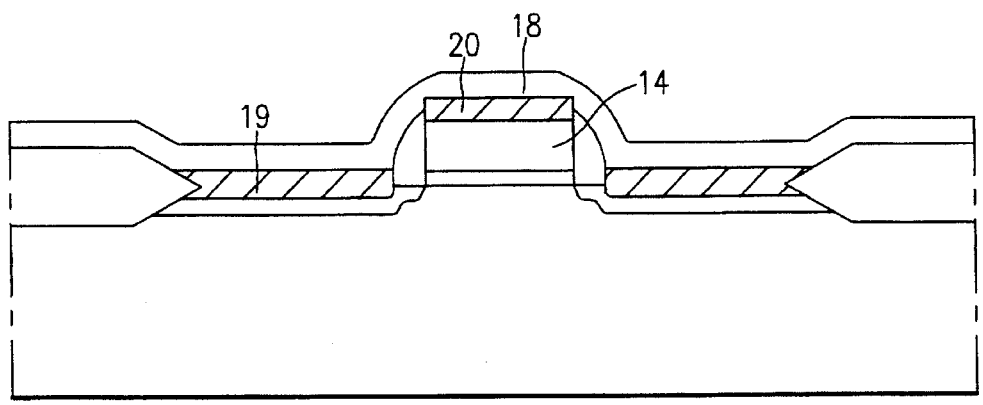
Figure 1D:
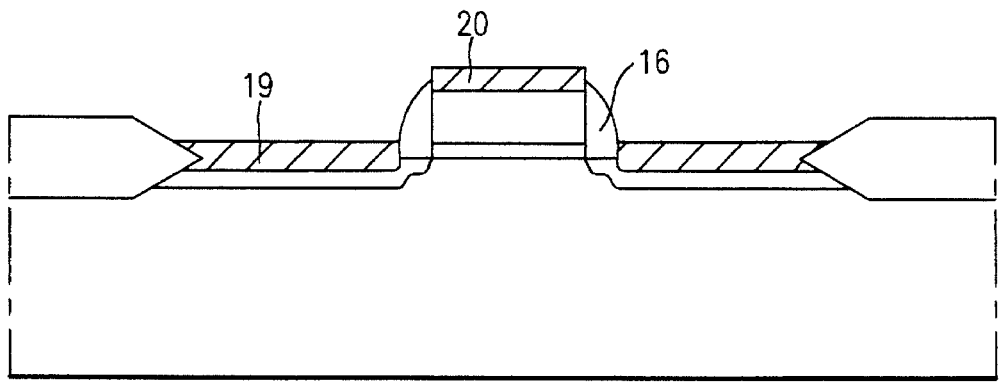
Figure 1E:
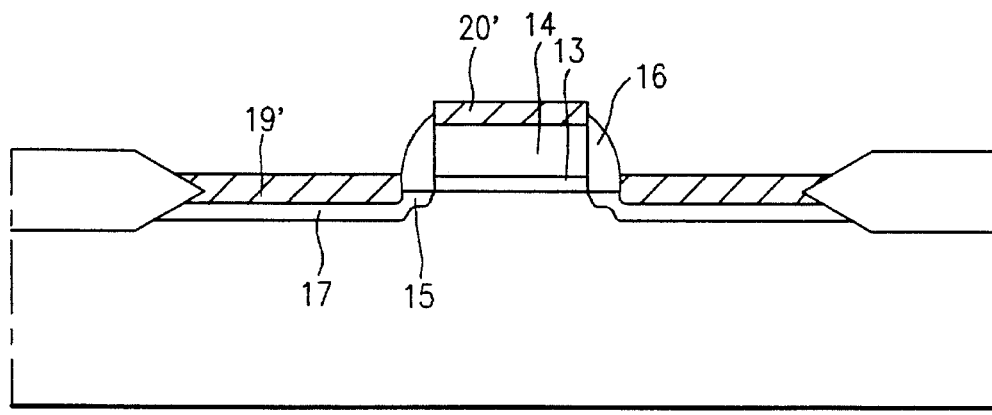
Figure 2:
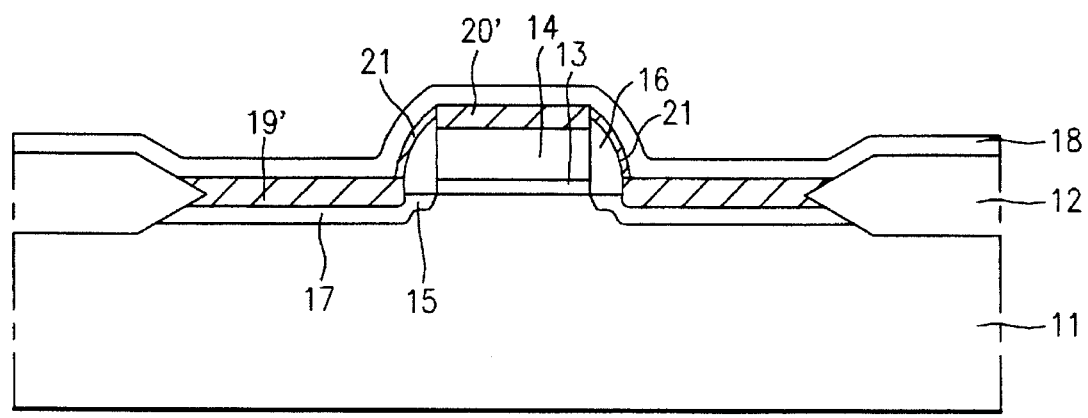
FIG. 2 is a schematic, cross-sectional view showing the formation of metal bridge caused by the conventional fabrication processes of FIG. 1.
Figure 3A:
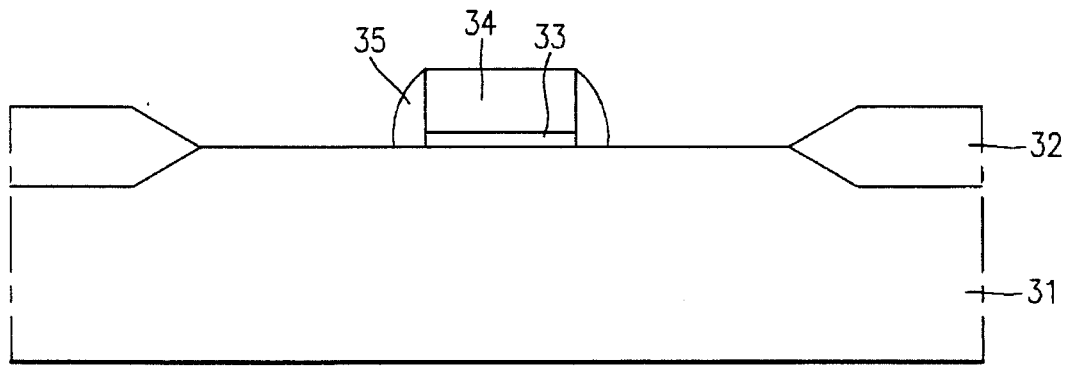
FIGS. 3A through 3G are schematic, cross-sectional views showing conventional fabrication processes for MOS transistor, employing a silicide as diffusion source (SADS) process.
Figure 3B:
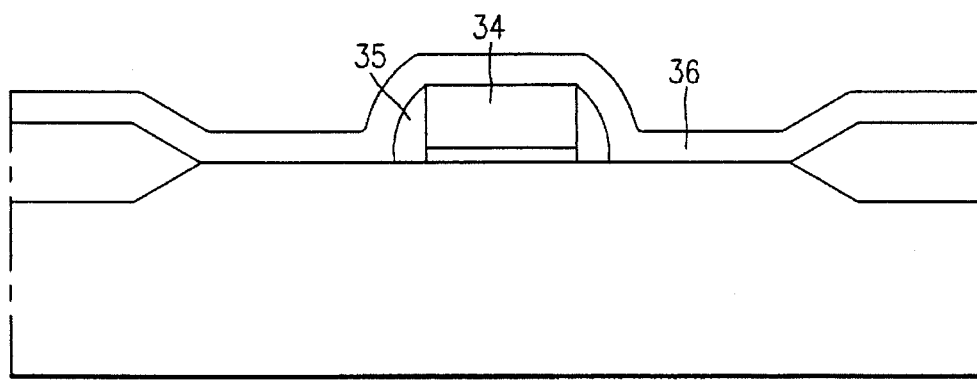
Figure 3C:
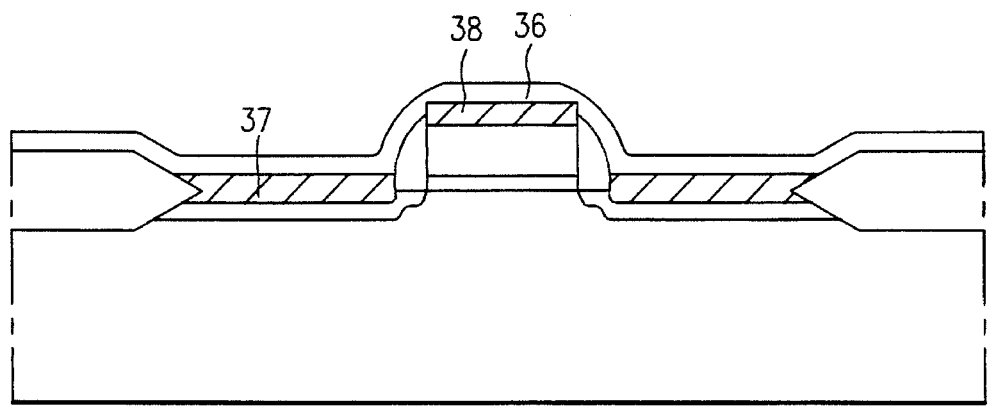
Figure 3D:
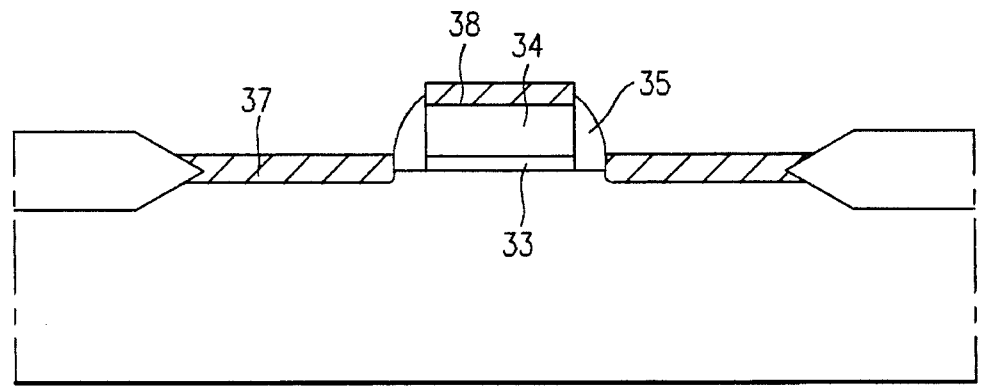
Figure 3E:
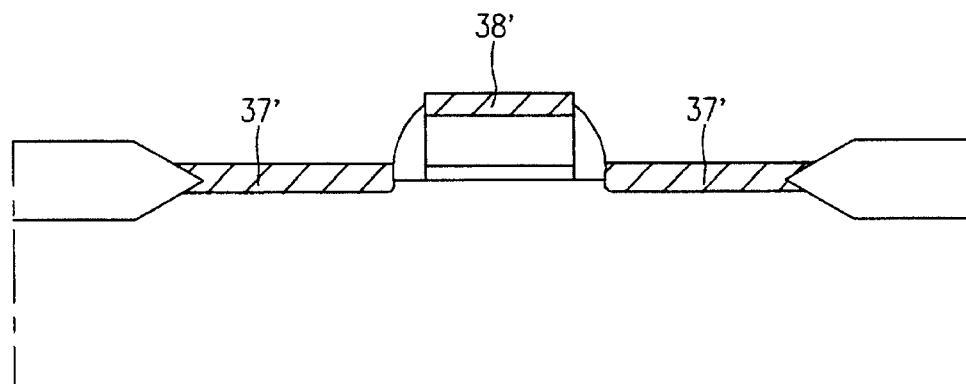
Figure 3F:
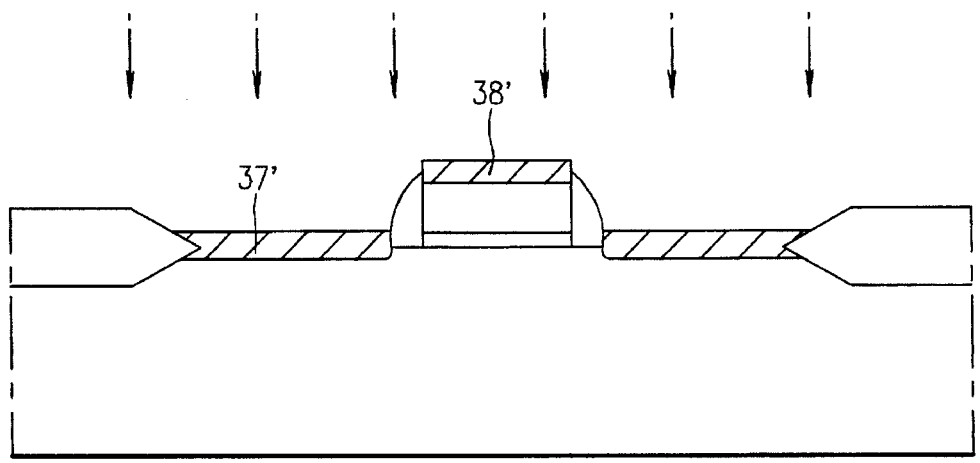
Figure 3G:
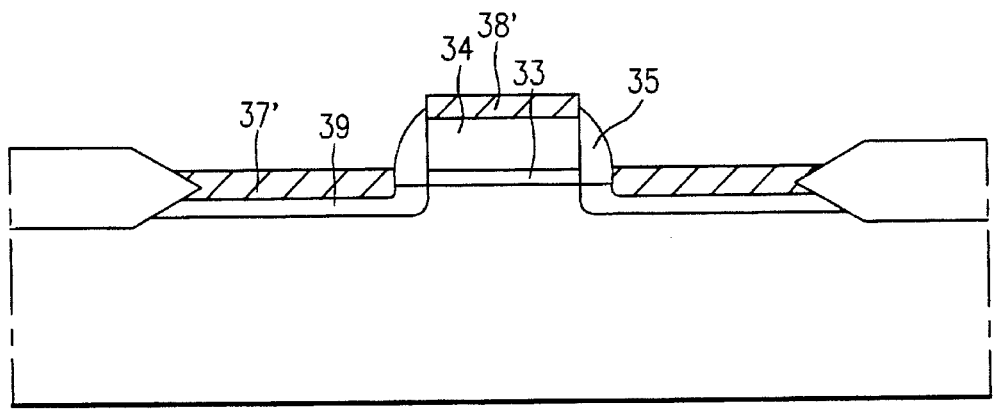

Hereinafter, the preferred embodiment of the present invention will be, in detail, described with reference to some drawings, wherein like reference numeral designate like parts, respectively.

Referring initially to FIGS. 4A through 4E, there is illustrated a method using a SADS process for fabricating a MOS transistor having a thin silicide and a source/drain region of shallow junction, according to the present invention.

Figure 4A:
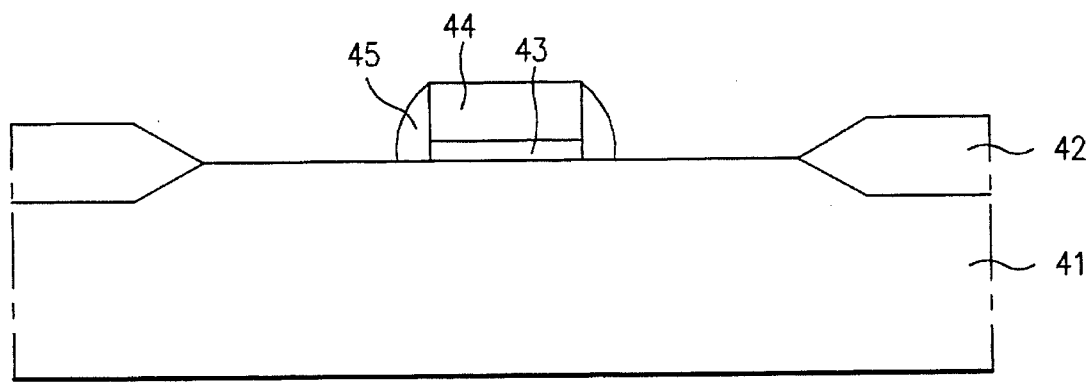
FIGS. 4A through 4E are schematic, cross-sectional views showing fabrication processes for MOS transistor, employing a SADS process, in accordance with the present invention.

First, as shown in FIG. 4A, a silicon substrate 41 is sectioned into a channel region and a device separation region by a field oxide film 42 formed by so-called LOCOS process, followed by the formation of a gate insulating film 43 and a gate of poly silicon film over the channel region, in due order. Then, a pair of spacers 45 consisting of an oxide film are formed at both side walls of the gate 43.

Figure 4B:
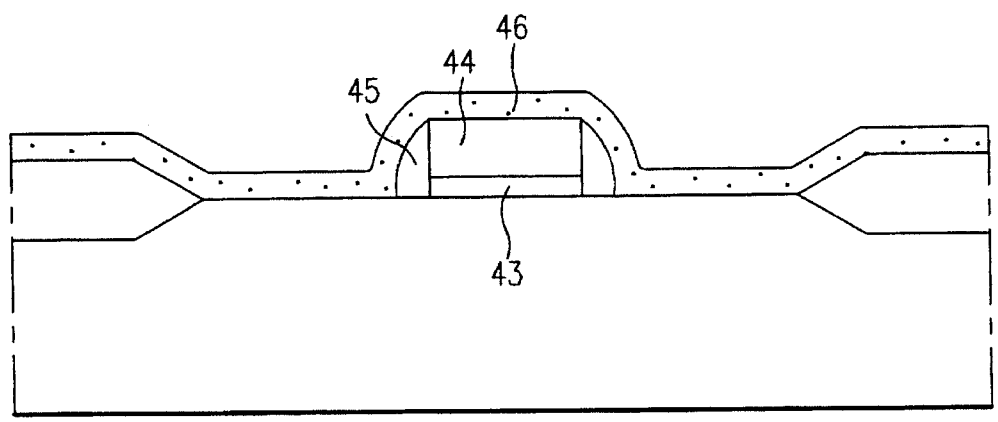

Next, on the entire resulting structure of FIG. 4A, as shown in FIG. 4B, there is thinly deposited a titanium nitride with excess of titanium, henceforth to be referred to as Ti-excessed titanium nitride (TiN$_x$, wherein 0<x<1) film 46 with a reactive sputtering process.

Figure 4C:
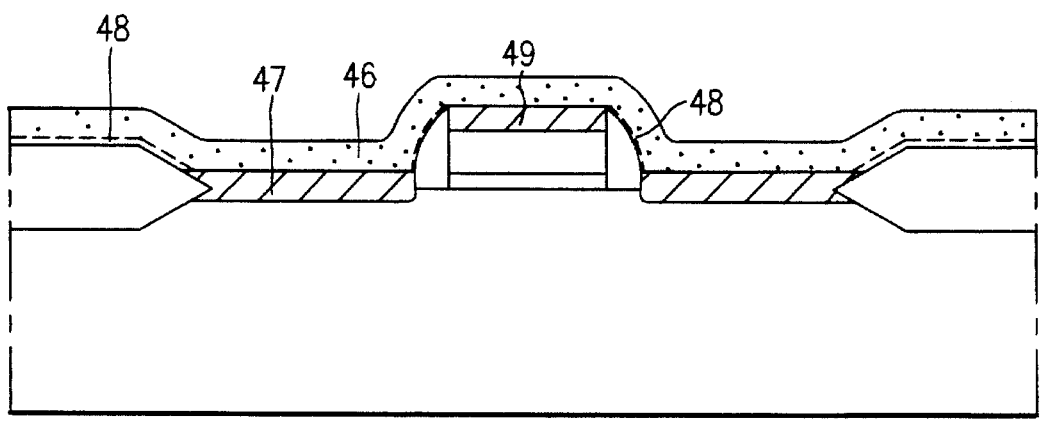

FIG. 4C illustrates the formation of two kinds of titanium silicide film 47 and 48. For this, a rapid thermal annealing (hereinafter "RTA") process is carried out at temperatures of about 800° C. under an nitrogen (N$_2$) or ammonia (NH$_3$) ambient. During the rapid thermal annealing, there is generated a phase separation phenomenon which results in that the titanium silicide film 47 of C54 phase, a SALICIDE film, is formed at the interface between the substrate 41 and the titanium nitride film 46, whereas the titanium silicide film 49 of C54 phase, a polycide film, is formed at the interface between the gate 44 and the titanium nitride film 46.

While the C54 phase films are formed, a film consisting of Ti$_x$O$_y$N$_z$ 48 is formed at the interfaces between the field oxide film 42 and the titanium nitride film 46 and between the side wall spacer 45 consisting of an oxide film and the titanium film 46, by virtue of the great oxidation energy of the titanium. This is because the oxidation energy of titanium is greater than that of silicon oxide (SiO$_2$).

The titanium silicide film 47 resulting from the phase separation is dependent on the x value of the thin titanium nitride film (TiN$_x$). That is, as the value of x is greater, the TiSi film formed is thicker. For example, when x=0.3, the thickness ratio of TiN to TiSi$_2$ is approximately 1:1.

Therefore, all the dopants are restrained within the thin titanium silicide film 47 even though the ion-implanting process is carried out under an acceleration energy of not less than 30 KeV. As a result, after the ion-implantation, the diffusion of the dopant into the substrate by the thermal annealing does not affect the electrical characteristics of the device formed.

In addition, according to the present invention, the metal bridge as formed in the conventional method is not formed even though the RTA is carried out at a high temperature of 800° C. Because, since the oxide film 48 is formed by virtue of the phase separation generated at the interface between the titanium nitride film 46 and the side wall spacer 45 during the thermal annealing at the high temperature, the titanium silicide film 47 is formed only on the silicon substrate 41, preventing the formation of the metal bridge over the side wall spacer 45.

Figure 4D:
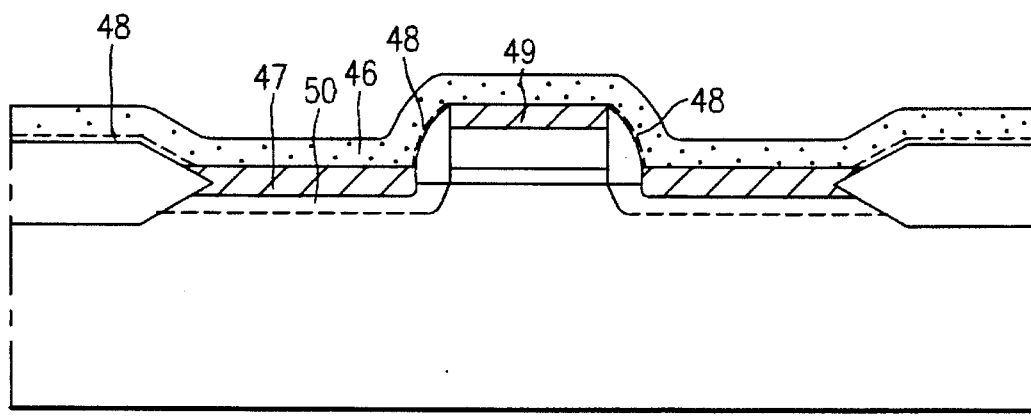

FIG. 4D illustrates the formation of a source/drain region 51 of shallow junction. For this, dopants having a conductive type opposite to the silicon substrate 41 are entirely implanted, as indicated by arrows, in the resulting structure and then, a thermal annealing is carried out, diffusing the dopants implanted into the substrate 41, so as to form the source/drain region 51 of shallow junction.

Figure 4E:
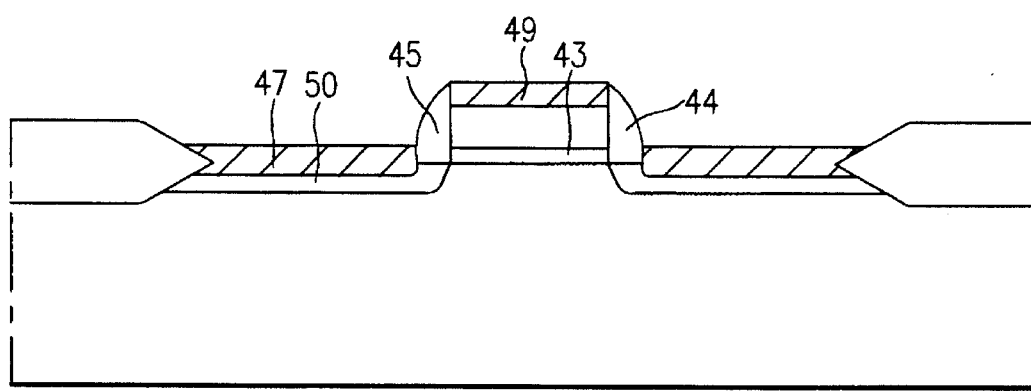

Finally, as shown in FIG. 4E, all remaining titanium nitride films 47 and 46' and Ti$_x$O$_y$N$_z$ film 48 but the titanium silicide films 48 and 49 are removed with a NH$_4$OH/H$_2$O$_2$ solution or other acid solutions, so as to give a MOS transistor having the thin silicide film and the source/drain region of shallow junction.

As described hereinbefore, the present method taking advantage of the phase separation of the Ti-excessed titanium nitride film is capable of forming the thin silicide film with once metal thermal annealing process and thus, of simplifying the processes as compared with the conventional method employing twice thermal annealing.

In addition, the consumption of the source/drain region is minimized, so that a titanium silicide film suitable to shallow junction can be obtained, preventive of the increase of the contact resistance, in accordance with the present invention.

Further, the improvement of device characteristic are also attributed to the lack of the metal bridge, which results from the function of the phase separation phenomenon preventing the formation of the metal bridge in spite of the thermal annealing of high temperature.

Furthermore, since the source/drain region is formed at an acceleration energy of not less than 30 KeV by employing a common ion-implanting apparatus, the present invention has significant advantages over the conventional methods, including the parasitic resistance such as the area resistance of the junction and the device characteristics.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A method for fabricating an MOS transistor having source and drain regions of shallow depth and a silicide film, including the steps of:

performing a field oxidation process to form a device separative field oxide film on a silicon substrate;

forming an insulating film on the silicon substrate and a polysilicon film on the insulating film; patterning the insulating film and the polysilicon film to form a gate insulating film and a gate;

forming oxide sidewall spacers on sidewalls of the gate;

depositing a Ti-excessed titanium nitride film on the silicon substrate, the gate, the sidewall spacers and the field oxide film;

performing a rapid thermal annealing process to form a titanium silicide film at an interface between the silicon substrate and the titanium nitride film and to form a titanium oxygen nitride film at an interface between the field oxide film and the titanium nitride film and at interfaces between the sidewall spacers and the titanium nitride film;

implanting dopant ions in the titanium nitride film and the titanium silicide film;

applying a thermal annealing process to the titanium nitride film and the titanium silicide film to diffuse the dopant ions into the silicon substrate, thereby forming the source and drain regions of shallow depth; and removing the titanium nitride film and the titanium oxygen nitride film.

2. A method according to claim 1, wherein the titanium nitride film is represented by the following formula $TiN_x$ wherein $0<x<1$.

3. A method according to claim 1, wherein said titanium nitride film is deposited by use of reactive sputtering process.

4. A method according to claim 1, wherein said rapid thermal annealing process is carried out at a temperature of around 800° C.

5. A method according to claim 1, wherein said rapid thermal annealing process is carried out under an ammonia or nitrogen ambient.

6. A method according to claim 1, wherein the dopant ions are implanted at an acceleration energy of not less than 30 KeV.

7. A method according to claim 1, wherein the titanium nitride film and the titanium oxygen nitride film are removed with an acid solution.

8. A method according to claim 7, wherein the acid solution is a $NH_4OH/H_2O_2$ solution.

* * * * *